United States Patent
Clewett et al.

(10) Patent No.: US 7,626,444 B2
(45) Date of Patent: Dec. 1, 2009

(54) AUTONOMOUS CONTROL OF MULTIPLE SUPPLY VOLTAGE GENERATORS FOR DISPLAY DRIVERS

(75) Inventors: David Clewett, Bassett (GB); Julian Tyrrell, Cricklade (GB); Stuart Levine, Stockbridge (GB); Anna Hedley, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 42 days.

(21) Appl. No.: 12/148,768

(22) Filed: Apr. 22, 2008

(65) Prior Publication Data

US 2009/0261888 A1 Oct. 22, 2009

(30) Foreign Application Priority Data

Apr. 18, 2008 (EP) .................................. 08368010

(51) Int. Cl.
G05F 1/10 (2006.01)
(52) U.S. Cl. ...................................................... 327/535
(58) Field of Classification Search ......... 327/535–537, 327/530, 589
See application file for complete search history.

(56) References Cited

U.S. PATENT DOCUMENTS

| 5,745,354 | A | 4/1998 | Raza |
| 5,889,664 | A * | 3/1999 | Oh .............................. 363/60 |
| 5,973,545 | A | 10/1999 | Raza |
| 6,370,075 | B1 | 4/2002 | Haeberli et al. |
| 6,717,458 | B1 | 4/2004 | Potanin |
| 6,760,262 | B2 | 7/2004 | Haeberli et al. |
| 6,801,077 | B2 | 10/2004 | Negoi |
| 7,119,579 | B2 * | 10/2006 | Chong et al. .................. 326/82 |
| 7,156,313 | B2 | 1/2007 | Ou et al. |
| 7,190,359 | B2 | 3/2007 | Yoneyama |
| 7,427,889 | B2 * | 9/2008 | Lin et al. ..................... 327/536 |

FOREIGN PATENT DOCUMENTS

| EP | 0 836 129 A1 | 4/1998 |
| EP | 1 298 777 A1 | 4/2003 |
| EP | 08368010.8-1242 | 10/2008 |

* cited by examiner

*Primary Examiner*—Lincoln Donovan
*Assistant Examiner*—Hal L Nguyen
(74) *Attorney, Agent, or Firm*—Saile Ackerman LLC; Stephen B. Ackerman

(57) ABSTRACT

Circuits and methods to operate an arrangement of one or more charge pumps with two or more power supplies where each supply is able to vary over a range of voltages, and where any one supply can be of a higher or lower voltage than any of the others have been achieved. In a preferred embodiment the output of the arrangement of charge pumps is used to drive an electronic display. The strongest power supply available is selected and the arrangement of one or more charge pumps is reconfigured according to the value of the actual strongest supply voltage. In case of a change of a source of supply voltage the operation of the charge pumps during the short time required for reconfiguration. While the charge pump is running it can be suspended, reconfigured and released or restarted in the case of a change of supply source, or simply reconfigured on-the-fly without suspending in the case of a selected supply voltage change.

23 Claims, 2 Drawing Sheets

AUTONOMOUS CONTROL OF MULTIPLE SUPPLY VOLTAGE GENERATORS FOR DISPLAY DRIVERS

BACKGROUND OF THE INVENTION (1) Field of the Invention

This invention relates generally to charge pumps and relates more specifically to charge pumps being capable to operate from one of multiple power supplies wherein each supply is able to vary over a range of voltages and where any one supply can be of a higher or lower voltage than the others.

(2) Description of the Prior Art

Electronic displays (e.g. LCDs, electrophoretic displays, etc.) generally require voltage multipliers such as e.g. charge pumps to operate. Where multiple power sources are available (e.g. mains, battery), which have different voltage outputs, reconfiguration of the charge pump has to be undertaken to:

a) maintain the output voltage for correct operation of the display and its driver b) prevent damage to components connected to the charge pump and c) prevent damage to the charge pump itself.

Examples for such different power sources could be a battery, terminal contacts, or terminal coils. It is a challenge for the designer of DC-to DC converters such as charge pumps providing the operation voltage of display drivers to achieve circuits and methods to enable a correct operation with one of two or more power supplies, where each of the power supplies is able to vary over a range of voltages and where any one supply can be of a higher or lower voltage than any of the others.

There are known patents or patent publications dealing with adjusting charge pumps to external voltage sources:

U.S. Patent (U.S. Pat. Nos. 6,370,075 and 6,760,262 to Haeberli et al) disclose an integrated circuit detecting the voltage level of a supply voltage to an integrated circuit. Circuitry on the integrated circuit including a charge pump circuitry adjusts to operate more effectively or efficiently at the voltage level of the supply voltage.

Furthermore there are known patents or patent publications dealing with charge pumps for display drivers:

U.S. Patent (U.S. Pat. No. 7,156,313 to Ou et al.) proposes an IC card with a display panel but without batteries including a contact/contactless communication interface, a microprocessor, an EEPROM, a rectifier/voltage regulator, a display driver, a charge-pump disposed therein, and a display panel disposed thereon. The microprocessor receives the external data, and displays the data on the display panel so that users can look up the external data. The display panel exhibits a double steady-state function having the characteristic that once the data are displayed, no persistent power supply for the display panel is needed, and thus the displayed data will be preserved persistently until the next time the data are updated. In this way, users are not required to use batteries and can avoid being disturbed by the service life of the batteries.

U.S. Patent (U.S. Pat. No. 6,801,077 to Negoi) discloses a charge pump device and a display driver with a charge pump device. Further it discloses to a display module with a display driver using a charge pump device and a telecom terminal having such a display module. To provide a device which needs a charge pump for generating a higher voltage as the supply voltage a charge pump device is proposed containing at least two stages, whereby a stage (S) comprises a switch and a charge device which are arranged to generate a voltage higher than the supply voltage, whereby the stages are arranged in series and a required multiplication factor of the charge pump is adjustable by activating/deactivating a definable number of stages, whereby the switches of each stage are arranged in the same way. Thereby it will achieved a freely programmable multiplication factor of the supply voltage and in the same time having switches in the charge pump which are optimized in the power consumption by programming a multiplication factor smaller than the maximum multiplication factor.

U.S. Patent (U.S. Pat. No. 7,190,359 to Yoneyama) discloses a display driver, an electro-optical device, and a display driving method that can regulate output voltages with high precision and without reducing reliability. The display driver includes an electronic volume value generating circuit that generates an electronic volume value for regulating output voltages, a power supply circuit that generates output voltages using a standard voltage amended based on the electronic volume value, a driving circuit that drives the electro-optical element based on the output voltages corresponding to display data, and an absolute value setting register for setting an electronic volume absolute value. The driving circuit uses an amendment value corresponding to a difference between a given characteristic value set in accordance with the electro-optical element being driven and a center value of a range that can be taken by the electronic volume value to amend the electronic volume absolute value, thereby generating the electronic volume value.

SUMMARY OF THE INVENTION

A principal object of the present invention is to achieve methods and systems to operate an arrangement of one or more charge pumps with two or more power supplies where each supply is able to vary over a range of voltages, and where any one supply can be of a higher or lower voltage than any of the others.

Another object of the present invention is to suspend the operation of the charge pumps during the short time required for reconfiguration, while still maintaining the output voltage of the charge pumps.

A further object of the present invention is to select the strongest power supply out of more than one power supplies.

A further object of the present invention is to reconfigure charge pumps according to a change of the value of an incoming supply voltage.

Another object of the present invention is to reconfigure charge pumps according to a change of the source of an incoming supply voltage.

In accordance with the objects of this invention a method to operate an arrangement of one or more charge pumps with two or more power supplies where each supply is able to vary over a range of voltages, and where any one supply can be of a higher or lower voltage than any of the others has been achieved. The method invented comprises, first, the following steps: (1) providing an arrangement of one or more reconfigurable charge pumps, multiple supply voltages, means to measure said supply voltages, a control unit, and an electronic device requiring an output voltage of said arrangement of one or more charge pumps, (2) selecting strongest supply source and measuring voltage of selected source, and (3) configuring said arrangement of charge pumps according power source selected and start its operation. These steps are followed by a supply change process comprising, first, steps of (5) checking, if said electronic device is ON, and, if positive, go to step (6), else turn off said arrangement of charge pumps and go to step (12), (6) checking if change of source of supply voltage is required, and, if negative, go to step (5), else go directly to step (7), and (7) suspending said arrangement of charge pumps, disconnecting said arrangement of charge pumps from supply source, selecting and switching to new supply source. The final steps of the supply change process are: (8) measuring selected supply voltage, (9) configuring said arrangement of charge pumps according selected power supply, (10) connecting said arrangement of charge pumps to new supply source, (11) resuming operation of said arrangement of charge pumps and go to step (5), and (12) end.

In accordance with the objects of this invention a system to operate an arrangement of one or more charge pumps with two or more power supplies where each supply is able to vary over a range of voltages, and where any one supply can be of a higher or lower voltage than any of the others has been achieved. The system invented is comprising, first, an arrangement of one or more charge pumps, wherein its input is connected to a charge pump supply switch block and its output is connected to a first terminal of a capacitor, more than one supply voltages, said charge pump supply switch block connected between said supply voltages and said arrangement of one or more charge pumps, wherein said charge pump switch block is controlled by a digital control unit, and said capacitor having its second terminal connected to ground. Furthermore the system comprises said digital control unit receiving information about a change of source of supply from a supply monitor and receiving a digital value of a supply voltage from an Analog-to-Digital converter, wherein said control unit is controlling a configuration change of said arrangement of one or more charge pumps and is controlling via an oscillator a suspension of operation of said arrangement of charge pumps while said charge pumps are reconfigured due to a change of source of supply voltage, said supply monitor receiving inputs from said supply voltages, wherein said supply monitor controls a main supply switch block, said main supply switch block being connected between said supply voltages and said Analog-to-Digital converter, and said Analog-to Digital converter having an input and an output, wherein its input is one of said supply voltages and its output is connected to said digital control unit; and said oscillator receiving a suspend signal from said digital control unit and having its output connected to a clock input port of said arrangement of one or more charge pumps.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and systems to operate charge pumps with one of two or more power supplies where each supply is able to vary over a range of voltages, and where any one supply can be of a higher or lower voltage than any of the others.

In a preferred embodiment of the invention the system invented is used in a smart card application where a charge pump is providing power for a display driver where power supplies for the charge pump can be e.g. any or all of: (1) battery, (2) card terminal contact and (3) card terminal coil. Other power supply sources could be used as well with the present invention. It should be understood that the present invention could be used for a multitude of applications using charge pumps, beyond providing an operating voltage for display drivers. The present invention can be used e.g. for any circuitry that requires a constant voltage from a charge pump whose output is (usually) higher than the incoming voltage. such as LCD, OLED, MEMs, Electrophoretic displays or EPROM, EEPROMs or similar memory devices.

Figure 1:
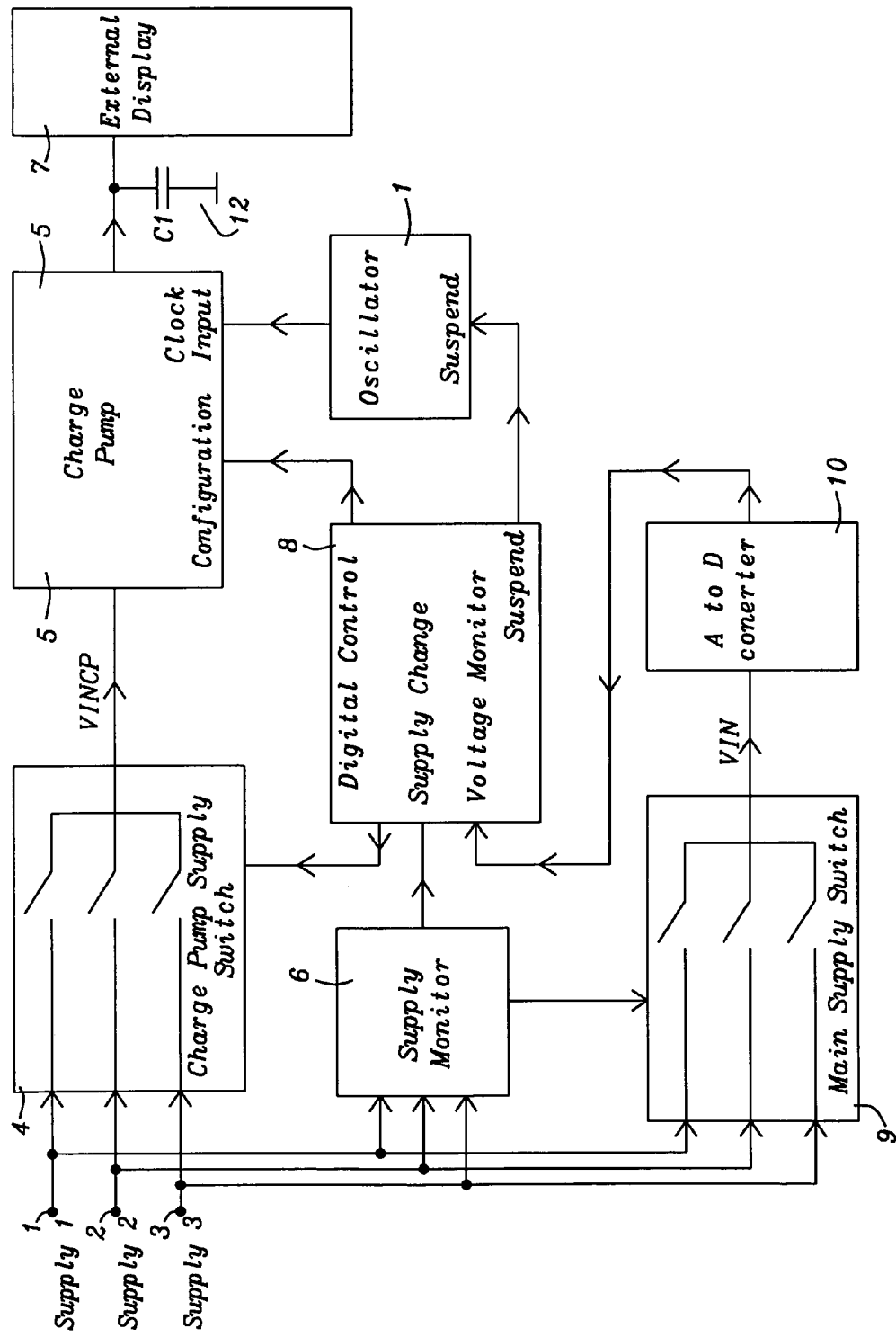
FIG. 1 shows a schematic block diagram of a preferred embodiment of the present invention.

FIG. 1 illustrates a block diagram of a preferred embodiment of the system invented. This block diagram comprises e.g. three supply voltages supplies 1, 2, and 3, e.g. a battery, a card terminal contact and a card terminal coil, which can provide power exclusively, a charge pump supply switch 4, an arrangement of one or more configurable charge pumps 5 and a supply monitor 6 and a main supply switch 9. When the display 7 is ON, the charge pump 5 is running and the active input voltage 1, 2, or 3 is continually monitored via the main supply switch 9 (e.g. every 10 ms) by the ADC 10 so that slowly changing voltage is catered for. Under these circumstances the charge pump is re-configured on-the-fly. The term "on-the-fly" specifically to means reconfiguration of the charge pump while it is running. While the charge pump is running it can be suspended, reconfigured and released or restarted in the case of a change of supply source, or simply reconfigured on-the-fly without suspending in the case of a selected supply voltage change.

In a preferred embodiment a charge pump is used comprising a series of two or more cascaded stages, the number of which depends on the input voltage and the required output voltage. Multiple charge pumps may be necessary where there is more than one display (or e.g. memory devices).

The supply monitor 6 detects the presence of one or more supply voltages and controls according to predefined rules, in conjunction with the digital control unit 8, the charge pump supply switch 4 and the main supply switch 9. The main supply switch 9 connects the selected supply voltage 1, 2, or 3 to the input voltage $V_{IN}$ of the Analog-to-Digital converter 10. The charge pump supply switch 4 connects the selected supply voltage 1, 2, or 3 to the input voltage $V_{INCP}$ of the arrangement of one or more configurable charge pumps 5 (only one charge pump is shown in FIG. 1). The Analog-to-Digital converter 10 measures the selected supply voltage. A digital control unit 8 is connected to the supply monitor 6, the charge pump supply switch 4, the arrangement of one or more configurable charge pumps 5, an oscillator 11 with glitch free suspend feature, and to the Analog-to-Digital converter 10. The digital control unit 8 receives information about a supply change from the supply monitor 6, it is receiving the voltage level of the selected supply voltage from the Analog-to-Digital converter 10 and is controlling a reconfiguration of the arrangement of charge pumps 5. A reservoir capacitor 12 at the output of the arrangement of one or more reconfigurable charge pumps 5 holds the voltage constant for the relatively short time while the arrangement of one or more charge pumps 5 is suspended. In a preferred embodiment of the invention the output voltage of the arrangement of one or more charge pump 5 is driving a display 7. The digital control 8 is written in VHSIC hardware description language VHDL and synthesized to a standard logic library. It contains the predetermined supply hierarchy of the power supplies. In this preferred embodiment all components shown, except the display, are integrated in an ASIC.

If the selected supply voltage source changes (i.e. when one supply is swapped for another) the charge pump clock, i.e. the oscillator 11 with a glitch free suspend feature, providing clock input to the arrangement of one or more charge pumps 5, is immediately suspended by a signal from the supply monitor 6 via the digital control unit 8, the selected charge pump supply switch 4 is opened, the incoming supply re-measured and the charge pump arrangement 5 reconfigured to cope with the new input voltage. When the reconfiguration is complete the charge pump supply switch 4 is closed to select the new supply, the oscillator 11 is released and the charge pump 5 resumes operation.

Figure 2:
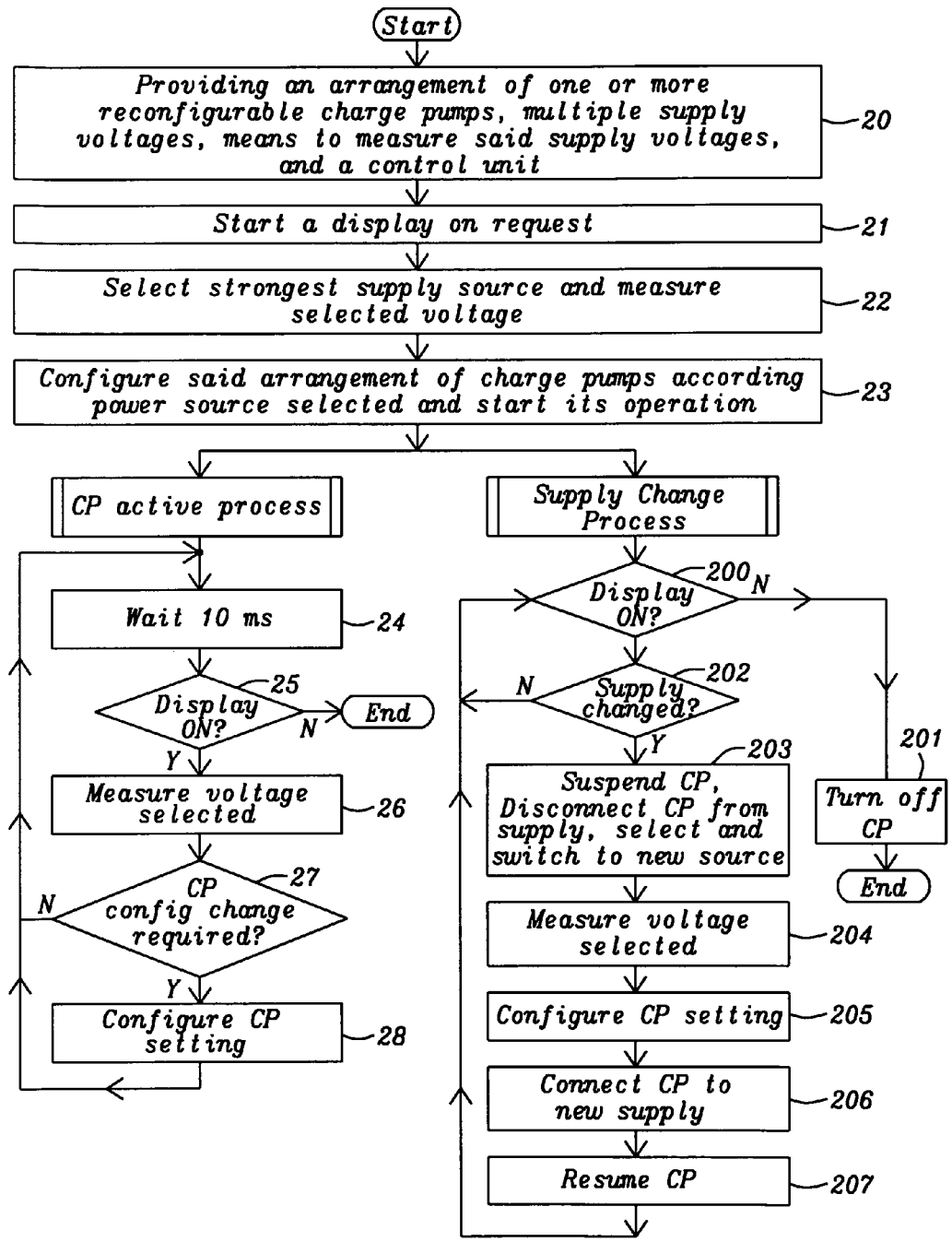
FIG. 2 illustrates a flowchart of the basic steps of a method to operate an arrangement of one or more charge pumps with two or more power supplies where each supply is able to vary over a range of voltages, and where any one supply can be of a higher or lower voltage than any of the others.

FIG. 2 illustrates a flowchart of the basic steps of a method to operate an arrangement of one or more charge pumps with two or more power supplies, where each supply is able to vary over a range of voltages, and where any one supply can be of a higher or lower voltage than any of the others. The method of FIG. 2 illustrates a preferred embodiment of the invention, namely a charge pump providing the operating voltage of a display; it is obvious that the charge pump could provide the operating voltage of other devices as well. Step 20 describes the provision of an arrangement of one or more reconfigurable charge pumps, multiple supply voltages, means to measure said supply voltages, and a control unit. The following step 21 illustrates starting a display on request. In step 22 the strongest of these power supplies is selected, and the selected voltage is measured. It should be understood that "strongest" power supply does not mean or imply "highest" power supply. In this particular implementation where there are 3 different supply sources, the hierarchy from strongest to weakest is e.g. contact, coil, battery. However the voltage range of each source means that the respective voltages could be 1.8V, 2.5V and 3V. Step 23 illustrates the configuration of the arrangement of one or more configurable charge pumps according to the supply voltage selected and the start of its operation. After turning ON the arrangement of charge pumps two concurrent processes follow, namely a "charge pump (CP) active process" and a "supply change process".

The first step 24 of the "CP active process" is a waiting time of a defined duration, in a preferred embodiment in the order of magnitude of 10 msec. Other waiting times are also possible. The following step 25 is a check if the display is ON and, if negative, the process flow goes to END, otherwise the process flow goes to step 26, wherein the voltage of the selected voltage source is measured. The following step 27 is a check, if the configuration of the charge pump is required, if positive, the charge pump is reconfigured in step 28 according to a change of the current supply voltage, otherwise the process flow goes back to the wait of step 24. It should be noted that in case of a change of the voltage level of the current source of supply voltage the reconfiguration of the charge pump can be performed without any suspension of the operation of the charge pump. Alternatively the operation of the charge pumps can be suspended during the time required for the reconfiguration.

The first step 200 of the "supply change process" is a check if the display is ON, and, if negative, the process flow goes to step 201, turning off the charge pumps and is goes then to END, otherwise the process flow goes to step 202, wherein a check is performed if the source of power supply has to be changed. In case this check is negative, the process flow goes back to the check of step 200, otherwise the process flow goes to step 203 disclosing the suspension and disconnection of said arrangement of one or more charge pumps, the selection and related connection to a new source of power supply. In the next step 204 the new source of supply voltage is measured by said means to measure the supply voltage. Step 205 describes the reconfiguration of said arrangement of one or more charge pumps according to the measurement of the new supply voltage, and in step 206 the arrangement of one or more charge pumps is connected to the new source of supply voltage. Finally, in step 207, the operation of the arrangement of charge pumps 5 is resumed and the process flow goes back to step 200.

It should be noted that the "supply change process", comprising steps 200-207 operates concurrently to the "CP active process", comprising steps 24-28, albeit the "supply change process" has priority over the "CP active process". The priority of the "supply change process" is ensured by the waiting time of step 24 of the "CP active process".

While the invention has been particularly shown and described with reference to the preferred embodiments thereof, it will be understood by those skilled in the art that various changes in form and details may be made without departing from the spirit and scope of the invention.

What is claimed is:

1. A method to operate an arrangement of one or more charge pumps with two or more power supplies where each supply is able to vary over a range of voltages, and where any one supply can be of a higher or lower voltage than any of the others and wherein said arrangement of one or more charge pumps provides power to an electronic device, comprising the following steps:
   (1) providing an arrangement of one or more reconfigurable charge pumps, multiple supply voltages, means to measure said supply voltages, a control unit, and an electronic device requiring an output voltage of said arrangement of one or more charge pumps;
   (2) selecting strongest supply source and measuring voltage of selected source;
   (3) configuring said arrangement of charge pumps according power source selected and start its operation;
   (4) starting supply change process comprising the steps:
   (5) checking if said electronic device is ON, and, if positive, go to step (6), else turn off said arrangement of charge pumps and go to step (12);
   (6) checking if change of source of supply voltage is required, and, if negative, go to step (5), else go directly to step (7);
   (7) suspending said arrangement of charge pumps, disconnecting said arrangement of charge pumps from supply source, selecting and switching to new supply source;
   (8) measuring selected supply voltage;
   (9) configuring said arrangement of charge pumps according selected power supply;
   (10) connecting said arrangement of charge pumps to new supply source;
   (11) resuming operation of said arrangement of charge pumps and go to step (5); and
   (12) end.

2. The method of claim 1 wherein a charge pump active process is performed concurrently to said supply change process wherein the charge pump active process comprises the steps of:
   (13) wait a defined delay time;
   (14) checking if said electronic device is ON, and, if positive, go to step (15), else go to step (18);
   (15) measuring selected supply voltage;
   (16) checking if a configuration change of said arrangement of charge pumps is required and, if negative, go to step (13), else go to step (17);
   (17) configure said arrangement of charge pumps according to the supply voltage measured and go to step (13) and
   (18) end.

3. The method of claim 2 wherein the supply change process has priority over the charge pump active process.

4. The method of claim 2 wherein said delay time has an order of magnitude of 10 milliseconds.

5. The method of claim 4 wherein said suspending the arrangement of charge pumps is initiated via a clocking device.

6. The method of claim 4 wherein said clocking device is an oscillator with a glitch free suspend feature and wherein said control unit provides a suspend signal to said oscillator.

7. The method of claim 6 wherein a capacitor at the output of said arrangement of charge pumps holds an output voltage constant for the time while the arrangement of one or more charge pumps is suspended.

8. The method of claim 1 wherein said electronic device is an electronic display.

9. The method of claim 1 wherein said electronic device is an electronic memory device.

10. The method of claim 1 wherein said charge pumps comprise a series of two or more cascaded stages.

11. The method of claim 1 wherein multiple charge pumps are used where there is more than one electronic device to be provided with power.

12. A system to operate an arrangement of one or more charge pumps with two or more power supplies where each supply is able to vary over a range of voltages, and where any one supply can be of a higher or lower voltage than any of the others and wherein said arrangement of one or more charge pumps provides power to an electronic device, comprising:

an arrangement of one or more charge pumps wherein its input is connected to a charge pump supply switch block and its output is connected to a first terminal of a capacitor, more than one supply voltages;

said charge pump supply switch block connected between said supply voltages and said arrangement of one or more charge pumps, wherein said charge pump switch block is controlled by a digital control unit;

said capacitor having its second terminal connected to ground;

said digital control unit receiving information about a change of source of supply from a supply monitor and receiving a digital value of a supply voltage from an Analog-to-Digital converter, wherein said control unit is controlling a configuration change of said arrangement of one or more charge pumps and is controlling via an oscillator a suspension of operation of said arrangement of charge pumps while said charge pumps are reconfigured due to a change of source of supply voltage;

said supply monitor receiving inputs from said supply voltages, wherein said supply monitor controls a main supply switch block;

said main supply switch block being connected between said supply voltages and said Analog-to-Digital converter;

said Analog-to-Digital converter having an input and an output, wherein its input is one of said supply voltages and its output is connected to said digital control unit; and said oscillator receiving a suspend signal from said digital control unit and having its output connected to an clock input port of said arrangement of one or more charge pumps.

13. The system of claim 12 wherein the voltage of each power supply is measured by said supply monitor and the strongest one is selected according to a predetermined hierarchy and switched via said main supply switch block to said Analog-to-Digital converter.

14. The system of claim 13 wherein said power supplies are a battery, a card terminal contact and a card terminal coil.

15. The system of claim 14 wherein the predetermined hierarchy from strongest to weakest is the card terminal contact, the card terminal coil, and the battery.

16. The system of claim 12 wherein a change to a source of said supply voltages is detected by said supply monitor, which immediately suspends via said digital control block said oscillators and hence the operation of said arrangement of charge pumps during the time required for reconfiguration of said arrangement.

17. The system of claim 12 wherein all components of the system are integrated in an ASIC.

18. The system of claim 17 wherein said ASIC is integrated in a smart card.

19. The system of claim 12 wherein said electronic device is an electronic display.

20. The system of claim 12 wherein said electronic device is an electronic memory device.

21. The system of claim 12 wherein said charge pumps comprise a series of two or more cascaded stages.

22. The system of claim 12 wherein multiple charge pumps are used where there is more than one electronic device to be provided with power.

23. The system of claim 12 wherein said digital control is written in VHSIC hardware description language (VHDL) and synthesized to a standard logic library, wherein said library contains a predetermined supply hierarchy of the power supplies.

* * * * *

UNITED STATES PATENT AND TRADEMARK OFFICE
CERTIFICATE OF CORRECTION

PATENT NO. : 7,626,444 B2 Page 1 of 1
APPLICATION NO. : 12/148768
DATED : December 1, 2009
INVENTOR(S) : David Clewett et al.

It is certified that error appears in the above-identified patent and that said Letters Patent is hereby corrected as shown below:

Title Page In the Inventors, (75), delete first Inventor "David Clewett, Bassett (GB)" and replace with -- David Clewett, Wooton Bassett (GB) --.

Signed and Sealed this

Ninth Day of February, 2010

David J. Kappos
*Director of the United States Patent and Trademark Office*